United States Patent
Schoch

(12) 
(10) Patent No.: US 6,732,043 B2
(45) Date of Patent: May 4, 2004

(54) METHOD AND ARRANGEMENT FOR DETERMINING THE STARTING ABILITY OF A STARTER BATTERY OF AN INTERNAL COMBUSTION ENGINE

(75) Inventor: Eberhard Schoch, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 234 days.

(21) Appl. No.: 09/989,793

(22) Filed: Nov. 19, 2001

(65) Prior Publication Data

US 2002/0082765 A1 Jun. 27, 2002

(30) Foreign Application Priority Data

Nov. 17, 2000 (DE) .......................................... 100 56 970

(51) Int. Cl.[7] .............................................. G01R 31/36
(52) U.S. Cl. ....................................... 701/113; 324/433
(58) Field of Search ....................... 701/113; 123/179.3; 307/10.6, 10.7; 290/38 R, 50; 340/455; 324/433

(56) References Cited

U.S. PATENT DOCUMENTS

6,118,252 A * 9/2000 Richter ........................ 320/132
6,424,157 B1 * 7/2002 Gollomp et al. ............ 324/430

FOREIGN PATENT DOCUMENTS

DE          197 05 634          8/1998

* cited by examiner

Primary Examiner—Andrew M. Dolinar
(74) Attorney, Agent, or Firm—Kenyon & Kenyon

(57) ABSTRACT

A method of determining the starting ability of a starter battery of an internal combustion engine, according to which a charge status of the starter battery is determined, which has an influence on starting ability. Also determined is a temperature which has an influence on starting ability, in particular the temperature of the starter battery. Moreover, an average voltage drop of the starter battery during a starting phase is calculated or determined, in particular during a turn-over phase of a starter motor, which is in an operative connection with the starter battery. The starting ability of the starter battery is estimated by comparing the calculated or determined average voltage drop with a threshold value.

8 Claims, 2 Drawing Sheets

METHOD AND ARRANGEMENT FOR DETERMINING THE STARTING ABILITY OF A STARTER BATTERY OF AN INTERNAL COMBUSTION ENGINE

FIELD OF THE INVENTION

The present invention relates to a method of determining the starting ability of a starter battery of an internal combustion engine and a corresponding arrangement.

BACKGROUND INFORMATION

In a motor vehicle (or another system supplied with power primarily from an internal combustion engine), the functioning of the starter battery of the internal combustion engine is one of the most important prerequisites for ensuring good working order. An internal combustion engine is usually started by an electric starter which obtains electric power for the starting operation from a starter battery. The starter must briefly apply a torque capable of turning over the internal combustion engine at a certain minimum rpm. To do so, a sufficiently high current must be flowing through the starter, i.e., a sufficiently high voltage must be applied to it. If the starter battery is very cold, very old or partially discharged, the internal resistance of the battery may become so high that insufficient current and voltage are available to ensure starting. Such a problem is described in German Patent No. 197 05 634, for example.

For example, if the no-load voltage and the internal resistance of a starter battery are known, the starting ability of the starter battery for a given starting current and temperature can be checked. To this end, the terminal voltage can be calculated from known parameters and compared with the minimum voltage required to achieve the starting rpm. This is important, for example, to guarantee starting ability in start-stop systems in that the engine is started well in advance before reaching the starting limit in order to thereby recharge the battery through the generator.

Since the internal resistance of the starter battery also depends on the age of the battery in addition to its charge status and temperature, it must be determined again repeatedly at regular intervals. To obtain only the ohmic resistance of the electrodes and the electrolyte, which is crucial for the starting operation, one method is to calculate the internal resistance from the voltage dip and the maximum current in starting. However, the large current measurement range required for this purpose of up to 1 kA or more and the high current gradients of up to 1 kA/msec that occur are problematical in this regard. This makes high demands on the current sensors in a battery management system and under some circumstances results in the need for an additional sensor for this high current measurement range.

SUMMARY OF THE INVENTION

An object of the present invention is to find the simplest possible method of determining the starting ability of a starter battery without having to determine a starting current of the battery.

According to the present invention, it is now possible to determine the starting ability of a starter battery of an internal combustion engine without determining or calculating the starting current of the battery. Therefore, in the case of battery management systems which sense the battery current for determining the charge status, the current measurement range is greatly limited in comparison with traditional options, because it is possible according to the present invention to omit the determination of the charge drawn in starting, which is usually low.

The present invention utilizes, instead of the internal resistance and the starting current of the battery, the average voltage drop in the starter battery during starting to determine the starting ability. In this way, it is possible to eliminate complicated sensors for measuring the starting current.

According to a preferred embodiment of the method according to the present invention, the average voltage drop calculated according to the present invention is compared with a threshold value with the help of an equation of the form $$U_0(soc, T_{Batt}) - \Delta U_{Batt,\,mitt}(soc, T_{Batt}) = U_{Batt,min}$$

where soc is the charge status of the starter battery, $T_{Batt}$ is the temperature of the battery, $U_0$ is the open-circuit voltage of the battery, $\Delta U_{Batt,\,mitt}$ is the average voltage drop in the battery during a starting phase and $U_{Batt,\,min}$ is the minimum voltage that can be used as a threshold value to achieve the starting rpm of the starter battery. It is usually possible to assume that minimum voltage $U_{Batt\,min}$ is known, charge status soc being supplied by the battery management system. On the basis of the known equation, it is also possible as an alternative to determine the minimum charge status for a successful start at a given starting temperature by solving the equation for soc.

According to another preferred embodiment of the method according to the present invention, the average voltage drop is calculated according to an equation $$\Delta U_{Batt,\,mitt}(soc, T_{Batt}) = 1/n * \Sigma(U_0(soc, T_{Batt}) - U_{Batt,\,i}) \quad i=1\ldots n$$

at times i=1 ... n during the turn-over phase of the starter motor. This yields an averaging, which permits the starting ability of a starter battery to be reliably estimated.

Open-circuit voltage $U_0$ of the battery at a known charge status is expediently determined according to an equation of the form $$(U_0(soc, T_{Batt}) = 6*(1.88+0.247*soc+(T_{BATT}-25)*0.23e-3)$$

at a known charge status and a known battery temperature and/or from the terminal voltage of the unloaded battery immediately before starting the internal combustion engine.

According to another preferred embodiment of the method according to the present invention, an engine characteristics map for the average voltage drop values is determined and stored as a function of the battery charge states and battery temperatures on the basis of average voltage drop values $\Delta U_{Batt,\,mitt}$ thus determined. Such an engine characteristics map makes is possible to determine the actual voltage drop values on the basis of the measurement or determination of the battery charge status and battery temperature through appropriate interpolation and extrapolation without having to perform specific calculations using the above equations.

DETAILED DESCRIPTION

The basis of the method according to the present invention is that the starting ability of a starter battery is checked on the basis of the average voltage drop during the turn-over phase of a starter motor of the internal combustion engine, which is in operative connection with the starter battery, by using the equation $$U_0(soc, T_{Batt}) - \Delta U_{Batt, mitt}(soc, T_{Batt}) = U_{Batt,min} \quad (1)$$

at a known charge status and known battery temperature. A minimum battery voltage $U_{Batt, min}$ is assumed here as known, while charge status soc is supplied by the battery management system.

At a known charge status, $U_0$ can be determined according to the equation $$(U_0(soc, T_{Batt}) = 6*(1.88 + 0.247*soc + (T_{BATT} - 25)*0.23e-3) \quad (2)$$

or, as an alternative, from the terminal voltage of the unloaded battery immediately before starting.

Voltage drop $\Delta U_{Batt}$ in the battery at the time of starting corresponds approximately to the product of the internal resistance of the battery and the starter current, so that in addition to the battery charge status and the battery temperature, aging effects of the battery, the starter and the internal combustion engine also influence this voltage drop, so that the respective values $\Delta U_{Batt, min}$ (soc, $T_{Batt}$) and an engine characteristics map generated on the basis of these values are adapted during operation. Since the starter current also depends on the engine temperature, equation (1) holds exactly only in the case of a cold start, i.e., when the engine and battery are initially at ambient temperature. In the case of a hot start, corresponding modifications are implemented which are essentially known and do not concern the basic idea of the present invention.

Figure 1:
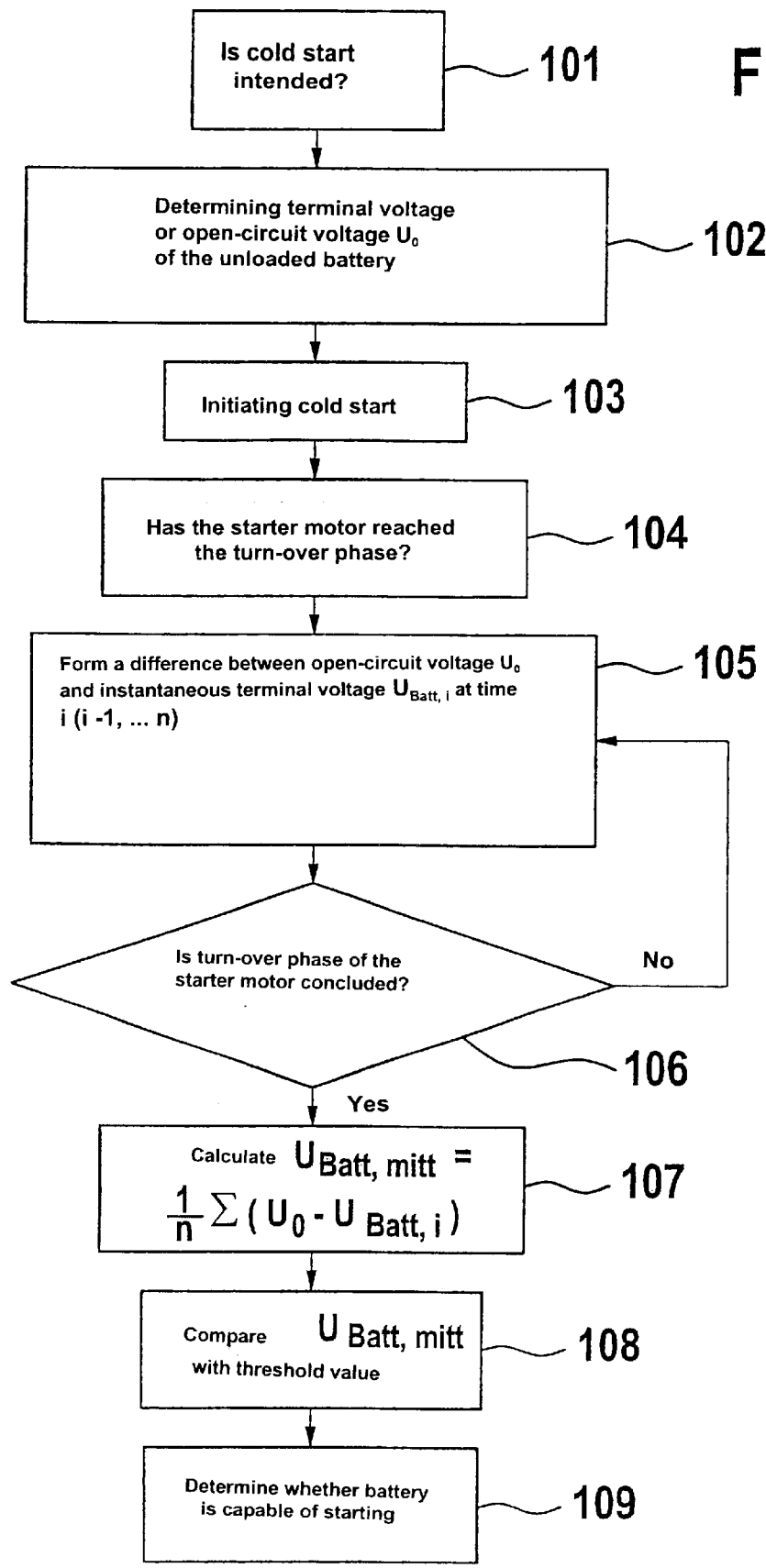
FIG. 1 shows a schematically simplified flow chart to illustrate the method according to the present invention.

The method according to the present invention will now be explained in greater detail for the case of a cold start on the basis of FIG. 1 as an example. In a step 101, it is first determined whether a cold start of the internal combustion engine is intended. This can be established, for example, by determining whether an ignition key has been turned. In a step 102, the terminal voltage, i.e., open-circuit voltage $U_0$ on the battery, which is as yet unloaded, is then determined. Next, in a step 103, the beginning of a cold start is initiated by operating a starter motor in an essentially known manner. In a step 104 a check is performed to determine whether the starter motor has reached its turn-over phase. If it is found that this is the case, then at a first instant i=1 the difference between open-circuit voltage $U_0$ and the instantaneous terminal voltage of the battery at time i=1, $U_{Batt, i=1}$ calculated and stored in a suitable memory. In a subsequent step 106, a check is performed to determine whether or not the turn-over phase is terminated. If the turn-over phase is not yet terminated, the method branches off back to step 105, where the difference $U_0 - U_{Batt, i}$ is calculated for an instant i=2. The branching off explained here between steps 105 and 106 takes place until it is ascertained in step 106 that the turn-over phase of the starter motor is terminated. In a successive run-through of step 105, the above-mentioned difference is formed at times i=1, 2, . . . n, the intervals between times i preferably being of equal length.

If the end of the turn-over phase is detected in step 106, then in a subsequent step 107 the value of $U_{Batt, mitt}$ is calculated according to an equation of the type:

$$\Delta U_{Batt, mitt}(soc, T_{Batt}) = 1/n * \Sigma(U_0(soc, T_{Batt}) - U_{Batt, i}) \quad (3)$$

In a subsequent step 108, the value of $\Delta U_{Batt, mitt}$ calculated according to equation (3) is compared with the minimum voltage, which is assumed as known, for reaching the starting rpm of the starter motor, namely $U_{Batt, min}$, is performed on the basis of equation (1). If this comparison turns out positive, i.e., the average voltage drop does not exceed a certain threshold value, then in a step 109 the starting ability of the starter battery is ascertained. If the average voltage drop is higher than this threshold value, however, then in step 109 the absence of starting ability of the battery is ascertained. In the latter case, it is expedient to initiate essentially known measures to nevertheless permit starting of the internal combustion engine, which is in an operative connection with the battery. Suitable measures here would include, for example, modifying the energy management system, e.g., by turning off consumers which are not necessary for starting the internal combustion engine or charging the starter battery by way of a storage battery which may be present. If it is found that the starting ability is in the borderline range, regeneration of the starter battery can be promoted through suitable measures such as increasing the idling rpm of the internal combustion engine.

Figure 2:
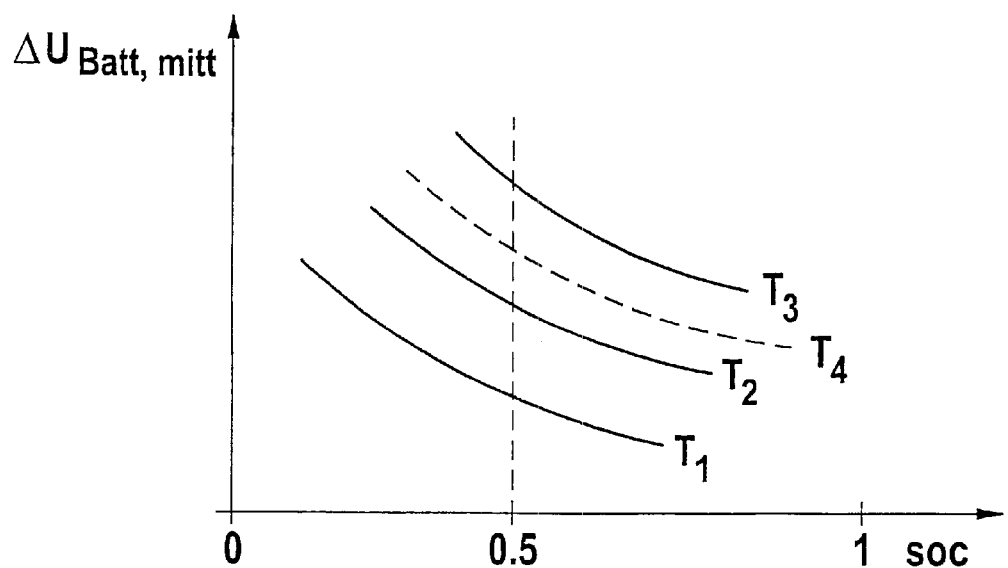
FIG. 2 shows an engine characteristics map that can be created and stored according to the present invention for the average voltage drop values as a function of the battery temperature and battery charge status.

By carrying out the method described here for a plurality of battery temperatures or charge states of the battery, it is possible to generate a corresponding engine characteristics map $\Delta U_{Batt, mitt}$ (soc, $T_{Batt}$). If the engine characteristics map is known with sufficient accuracy, it is possible to derive the starting ability for a given charge status soc and a given battery temperature $T_{Batt}$ or a corresponding average voltage drop $\Delta U_{Batt, mitt}$ from the measured engine characteristics map points by interpolation and extrapolation, in which case it is not necessary to perform the actual calculations according to equations (1) and (3). A typical engine characteristics map $U_{Batt, mitt}$ (soc, $T_{Batt}$) is shown in a simplified schematic form in FIG. 2. It can be seen here that a decline in the average voltage drop in the battery during the starting operation can be expected with an increase in the battery charge or a better battery charge status soc for a specific temperature. For example, if it is found that the battery charge status is soc=0.5 and a temperature T4 between T2 and T3 prevails, then through appropriate interpolation (indicated with dotted lines), an average voltage drop prevailing specifically under the given conditions can be derived.

To simplify interpolation and extrapolation, the dependence of the average voltage drop on charge status soc can be separated because the average voltage drop is attributed to the charge status-dependent conductivity of the electrolyte used in the battery, for which the following proportionality can be given in the range of soc>0.5:

$$\text{conductivity} \sim (3.012*soc - 2.011*soc^2) \quad (4)$$

$\Delta U_{Batt, mitt}$ can thus be scaled for various charge states according to $$\Delta U_{Batt\ mitt}(soc, T_{Batt}) = (3.012*soc_0 - 2.011*soc^2)/(3.012*soc_0 2.011*soc^2) * \Delta U_{Batt, mitt}(soc, T_{Batt}) \quad (5)$$

with respect to a reference state $soc_0$.

Figure 3:
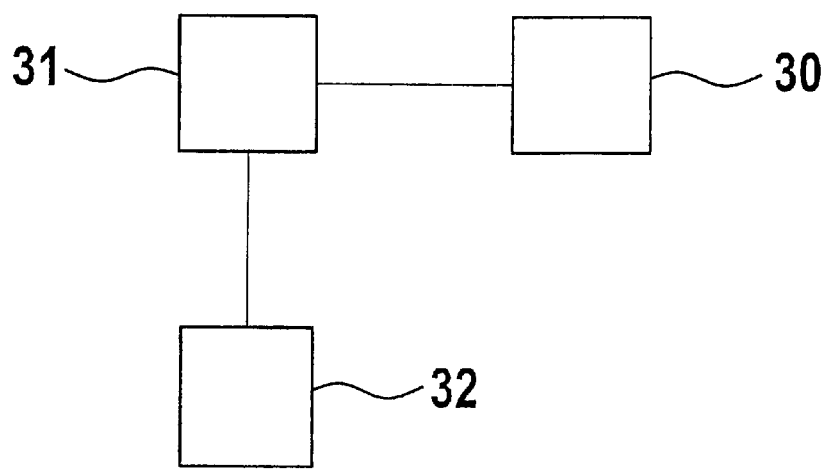
FIG. 3 shows a greatly simplified diagram showing components of the arrangement according to the present invention.

It should be pointed out with reference to FIG. 3 that the element for detecting a temperature which has an influence on starting ability may be designed in the form of a temperature sensor. The element for calculating or ascertaining an average voltage drop of the starter battery during the starting phase is designed in particular in the form of a computing device 31 which may also contain the element for estimating the starting ability by comparing the calculated average voltage drop with a threshold value. A battery management device via which a battery charge status soc can be sent to computing device 31 is labeled as 32.

What is claimed is:

1. A method of determining a starting ability of a starter battery of an internal combustion engine, comprising:

determining a charge status of the starter battery, the charge status having an influence on the starting ability;

determining a temperature that has an influence on the starting ability;

one of calculating and determining an average voltage drop of the starter battery during a starting phase of a starter motor that is in an operative connection with the starter battery; and estimating the starting ability of the starter battery by comparing the one of calculated and determined average voltage drop with a threshold value;

wherein:

the one of calculated and determined average voltage drop is compared with the threshold value in accordance with an equation of the form $$U_0(soc, T_{Batt}) - \Delta U_{Batt, mitt}(soc, T_{Batt}) = U_{Batt, min}, \text{ and}$$

soc is the charge status, $T_{Batt}$ is the temperature corresponding to a temperature of the starter battery, $U_0$ is an open-circuit voltage of the starter battery, $\Delta U_{Batt, mitt}$ is the one of calculated and determined average voltage drop, and $U_{Batt, min}$ is the threshold value corresponding to a minimum voltage of the starter battery that can be used to achieve a starter rpm.

2. The method according to claim 1, wherein:

the one of calculated and determined average voltage drop is calculated according to an equation of the form $$\Delta U_{Batt, mitt}(soc, T_{Batt}) = 1/n * \Sigma(U_0(soc, T_{Batt}) - U_{Batt, i})$$

at times i=1 . . . n.

3. The method according to claim 1, wherein:

the open-circuit voltage of the starter battery is determined on the basis of an equation of the form $$(U_0(soc, T_{Batt}) = 6*(1.88 + 0.247*soc = (T_{BATT} - 25)*0.23e - 3).$$

4. A method of determining a starting ability of a starter battery of an internal combustion engine, comprising:

determining a charge status of the starter battery, the charge status having an influence on the starting ability;

determining a temperature that has an influence on the starting ability, wherein the temperature corresponds to a temperature of the starter battery;

one of calculating and determining an average voltage drop of the starter battery during a starting phase of a starter motor that is in an operative connection with the starter battery;

estimating the starting ability of the starter battery by comparing the one of calculated and determined average voltage drop with a threshold value; and determining and storing an engine characteristics map of the one of calculated and determined average voltage drop as a function of the temperature of the starter battery and the charge status on the basis of values thus obtained for the one of calculated and determined average voltage drop.

5. An arrangement for determining a starting ability of a starter battery of an internal combustion engine, comprising:

an element for determining a charge status of the starter battery, the charge status having an influence on the starting ability;

an element for determining a temperature that has an influence on the starting ability;

an element for one of calculating and determining an average voltage drop of the starter battery during a starting phase of a starter motor that is in an operative connection with the starter battery; and an element for estimating the starting ability of the starter battery by comparing the one of calculated and determined average voltage drop with a threshold value;

wherein the one of calculated and determined average voltage drop is compared with the threshold value in accordance with an equation of the form $$U_0(soc, T_{Batt}) - \Delta U_{Batt, mitt}(soc, T_{Batt}) = U_{Batt,min}, \text{ and}$$

soc is the charge status, $T_{Batt}$ is the temperature corresponding to a temperature of the starter batten, $U_0$ is an open-circuit voltage of the starter battery, $\Delta U_{Batt, mitt}$ is the one of calculated and determined average voltage drop, and $U_{Batt, min}$ is the threshold value corresponding to a minimum voltage of the starter battery that can be used to achieve a starter rpm.

6. The arrangement according to claim 5, wherein:

the temperature corresponds to a temperature of the starter battery.

7. The arrangement according to claim 5, wherein:

the starting phase is a turn-over phase of the starter motor.

8. An arrangement for determining a starting ability of a starter battery of an internal combustion engine, comprising:

an element for determining a charge status of the starter battery, the charge status having an influence on the starting ability;

an element for determining a temperature that has an influence on the starting ability, wherein the temperature corresponds to a temperature of the starter battery;

an element for one of calculating and determining an average voltage drop of the starter battery during a starting phase of a starter motor that is in an operative connection with the starter battery;

an element for estimating the starting ability of the starter battery by comparing the one of calculated and determined average voltage drop with a threshold value; and an element for determining and storing an engine characteristics map of the one of calculated and determined average voltage drop as a function of the temperature of the starter battery and the charge status on the basis of values thus obtained for the one of calculated and determined average voltage drop.

* * * * *

UNITED STATES PATENT AND TRADEMARK OFFICE
CERTIFICATE OF CORRECTION

PATENT NO. : 6,732,043 B2
DATED : May 4, 2004
INVENTOR(S) : Eberhard Schoch

It is certified that error appears in the above-identified patent and that said Letters Patent is hereby corrected as shown below:

Column 3,
Line 49, change "$U_{batt, t=1}$" to -- $U_{batt, t=1}$ --

Column 4,
Line 55, change "$(3.012*soc_0 2.011*soc^2)*\Delta U_{Batt, mitt}(soc, T_{Batt})$" to
-- $(3.012*soc-2.011*soc^2)*\Delta U_{Batt, mitt}(soc, T_{Batt})$ --

Column 6,
Line 26, change "of the starter batten," to -- of the starter battery, --

Signed and Sealed this

Twenty-second Day of March, 2005

JON W. DUDAS
*Director of the United States Patent and Trademark Office*